United States Patent
Permuy

(10) Patent No.: US 6,307,155 B1
(45) Date of Patent: Oct. 23, 2001

(54) DEVICE FOR MECHANICALLY LOCKING AN ELECTRONIC COMPONENT WITH RESPECT TO A SUPPORT

(75) Inventor: Alfred Permuy, Malmaison (FR)

(73) Assignee: Valeo Electronique, Creteil Cedex (FR)

( * ) Notice: Subject to any disclaimer, the term of this patent is extended or adjusted under 35 U.S.C. 154(b) by 0 days.

(21) Appl. No.: 09/446,853

(22) PCT Filed: Apr. 30, 1999

(86) PCT No.: PCT/FR99/01043

§ 371 Date: Dec. 28, 1999

§ 102(e) Date: Dec. 28, 1999

(87) PCT Pub. No.: WO99/57950

PCT Pub. Date: Nov. 11, 1999

(30) Foreign Application Priority Data

Apr. 30, 1998 (FR) .................................................. 98 05529

(51) Int. Cl.$^7$ ................................. H02G 3/08; H05K 7/20
(52) U.S. Cl. ......................... 174/52.1; 361/707; 257/727
(58) Field of Search ........................ 174/52.1; 361/748, 361/760, 704, 707, 709, 717, 718, 719, 722, 825, 807, 809; 267/160, 158; 257/726, 727

(56) References Cited

U.S. PATENT DOCUMENTS

| | | |
|---|---|---|
| 4,707,726 | 11/1987 | Tinder . |
| 4,899,255 | * 2/1990 | Case et al. ............................ 361/386 |
| 5,225,965 | 7/1993 | Bailey . |
| 5,327,324 | * 7/1994 | Roth ..................................... 361/707 |
| 5,731,955 | * 3/1998 | Bartanen et al. .................... 361/704 |

FOREIGN PATENT DOCUMENTS

| | | |
|---|---|---|
| 0 788 155 | 8/1997 | (EP) . |
| 2 581 249 | 10/1986 | (FR) . |

* cited by examiner

*Primary Examiner*—Dean A. Reichard
*Assistant Examiner*—Carmelo Oliva
(74) *Attorney, Agent, or Firm*—Morgan & Finnegan, LLP

(57) ABSTRACT

The invention concerns a device for mechanically locking with respect to a support an electronic component soldered on a printed circuit card directly mounted on said support. The invention comprises a main wall designed to rest against a support wall and at least an elastic tab forming a U-shaped back loop relative to said main wall, said main wall and said elastic tab bearing matching means for maintaining said tab in a position wherein it is compressed towards said main wall, said matching means being capable of being disengaged relative to one another by the effect of a tool actuated by an operator, said elastic tab being then released to be urged against the component.

20 Claims, 1 Drawing Sheet

U.S. Patent    Oct. 23, 2001    US 6,307,155 B1
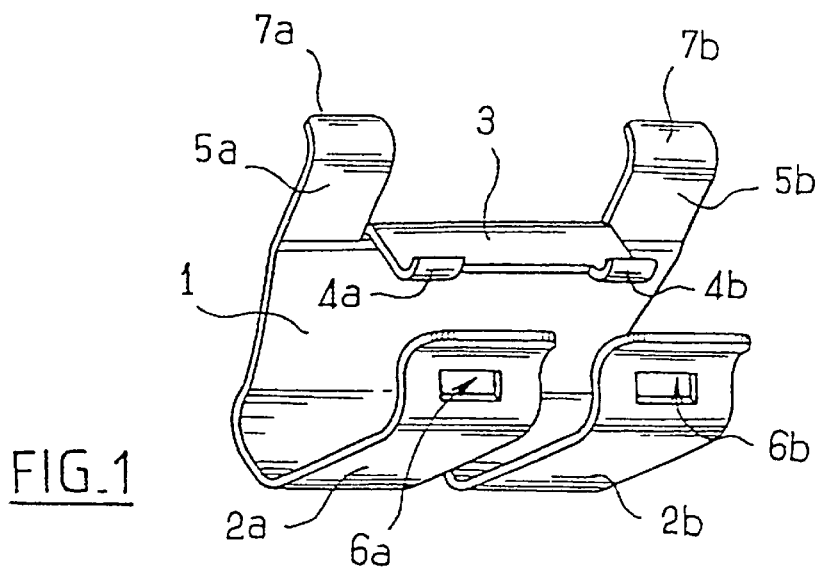
FIG_1
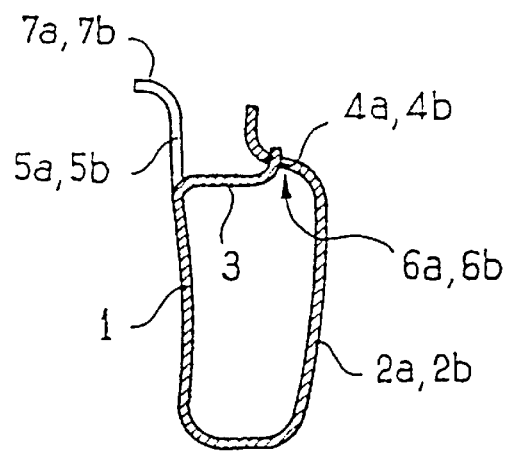
FIG_2
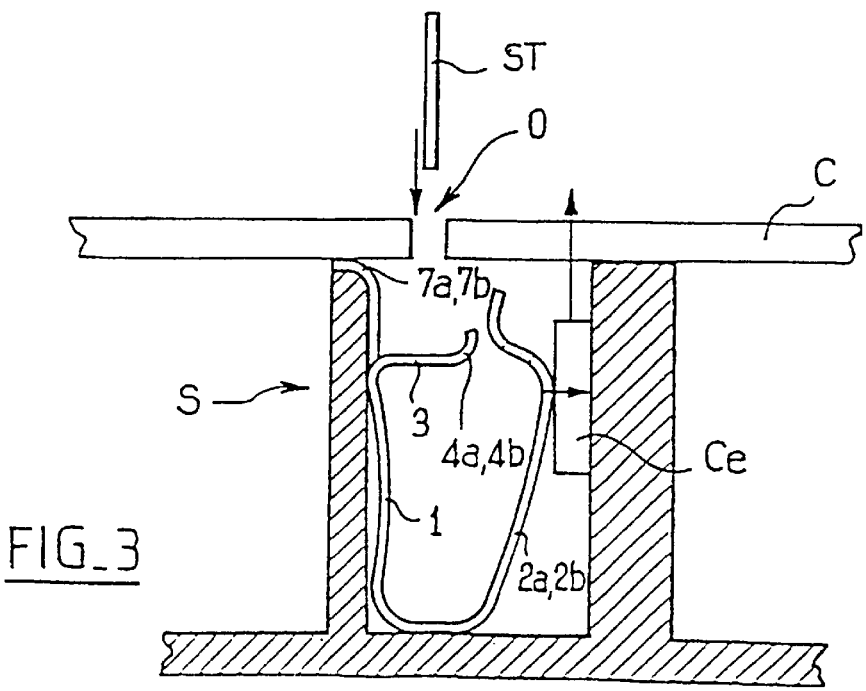
FIG_3

DEVICE FOR MECHANICALLY LOCKING AN ELECTRONIC COMPONENT WITH RESPECT TO A SUPPORT

BACKGROUND OF THE INVENTION

The present invention relates to a device for mechanically retaining an electronic component in place with respect to a support.

More particularly the invention relates to devices which are used, especially in the automotive field, for the purpose of retaining in place, on a support such as a metal sole plate, a component which is also welded to a printed circuit board that is attached on the said support.

At the present time, two main types of technique are known for the assembly of such a structure.

A first method consists in putting the component in place on the support, mounting on the support and the component a mechanical device for fixing the position of the said component on the said support, then putting the board in place on the support, and finally soldering the component to the said board.

Another method consists in first soldering the components on the board, then putting the board in place on the support, and then putting in place, on the support and the component, a mechanical device for fixing the position of the component on the support.

However, these two methods both have the disadvantage that they make it necessary to provide large clearances on the board in order to permit either soldering operations or the fitting in place of the mechanical retaining devices.

Such clearances are a disadvantage because they limit the surface area of the board which is able to carry conductors, and this limitation exists in the vicinity of the components, while certain components, such as power transistors, make it necessary to be able to dispose conductive tracks over a substantial width in the vicinity of the points on the board to which they are soldered.

The retaining device and the method which are proposed by the invention enable these disadvantages to be overcome.

BRIEF SUMMARY OF THE INVENTION

To this end, the retaining device which is proposed by the invention comprises a main wall in engagement against a wall of the support, together with at least one elastic arm defining a U-shaped return with respect to the said main wall, the said main wall and the said elastic arm carrying complementary means which enable the said arm to be maintained in a position in which it is compressed towards the said main wall, the said complementary means being adapted to be disengaged with respect to each other, the said resilient arm being then released so as to come into abutment against the component.

In particular, in one preferred embodiment, the main wall is extended at its end opposite to the resilient arm by a plate portion which is turned back towards the said arm, the complementary means which enable the said arm to be held in a compressed position being carried by the said arm and by the said plate portion, the said means being adapted to be disengaged by exertion of a thrust force exerted on the said plate portion by an operator, by a forming mechanism, by heating, or by cooling on the said plate portion, using a tool such as, for example, a stylus.

As to the method of assembly which is proposed by the invention, this is characterised in that a device of the above type is positioned on the said support in such a way that its main wall is in abutment against a wall of the said support, and in such a way that the arm (or arms) of the said device is (or are) disposed in facing relationship with a housing which is adapted to receive a component to be retained in place, the said arm (or the said arms) being compressed towards the main wall, in that the printed circuit board is placed on the said support, the component having been soldered to the latter beforehand and being then put in place within the said housing, and in that the arm (or arms) of the device are released by means of a tool so that they come into abutment against the component.

In particular, in the case where the retaining device has a return plate portion, in order to disengage the means retaining the arm (or arms) in a compressed position towards the main wall, the operator engages his tool in an aperture of the printed circuit board, and exerts with the said tool a thrust on the return plate portion of the device.

Further features and advantages of the invention will appear more clearly from the following description. This description is purely illustrative and is not limiting. It is to be read with reference to the attached drawings, in which:

BRIEF DESCRIPTION OF THE DRAWINGS

FIG. 1 is a perspective view of a device in one embodiment of the invention;

FIG. 2 is a view of the device of FIG. 1 in cross section, in the case where the lugs of the said device are in their compressed position;

FIG. 3 shows the mounting of the printed circuit board on the support.

DETAILED DESCRIPTION OF THE INVENTION

The device shown in the drawings is a component which is in the form of a spring that has a main wall 1 which is adapted to be applied back-to-back to a complementary wall of a support, together with two parallel elastic arms 2a and 2b which extend the said wall 1, and each of which defines a U-shaped return with respect to the latter.

At its opposite end from the elastic arms 2a and 2b, the wall 1 is also extended, firstly by a return which consists of a central plate portion 3 and which is substantially at right angles with respect to the wall 1, and secondly by two positioning tongues 5a, 5b which are extensions of the wall 1 and which lie in the plane of the latter on either side of the plate portion 3.

The edge of the plate portion 3 opposite to the wall 1 carries two lugs 4a and 4b, in the form of hooks, which are located in facing relationship with two holes 6a and 6b of the arms 2a and 2b, and with which the said lugs 4a and 4b are arranged to cooperate so as to hold the said arms 2a and 2b in a position in which the latter are compressed towards the said wall 1.

The tongues 5a and 5b are terminated by curved-back flanges 7a, 7b which enable the device to be located with respect to the edge of the wall on which it is to abut, the device being thus necessarily positioned at a given height with respect to the said wall.

Although it is not shown, it is also possible to arrange, on the device and on the support, means such as fins and complementary guide rails, which enable the position of the device with respect to the transverse direction of the wall of the support on which it is to abut, to be defined beforehand.

The mounting of a printed circuit board on a support, using such a retaining device, will now be described.

The arms 2a and 2b are initially compressed towards the wall 1 (FIG. 2), being held in this position by the cooperation of the hook-shaped lugs 4a, 4b and holes 6a, 6b.

In this compressed condition, the device is put in place on the wall S of the support on which it is to be engaged (FIG. 3). As has already been explained, the support consists for example of a metal sole plate.

In particular, it is slid along the said wall S until the flanges 7a and 7b come into abutment on the edge of the said wall.

The electronic board C is then put in position on the support.

The electronic components Ce have been soldered to the latter beforehand.

While the board C is being put in position, the electronic components Ce are positioned in the openings in the support which are provided in order to receive them.

An operator then applies a suitable tool, such as a stylus ST which he passes through an aperture O of the board C (see the arrow in FIG. 3), on the plate portion 3 which is deformed elastically and which releases the arms 2a, 2b with respect to the lugs 4a and 4b.

The said arms 2a and 2b come into engagement on the electronic component Ce towards which they are facing (FIG. 3). They exert on the latter an elastic force which forces it against another wall of the support. The said arms 2a and 2b thus give retention of the component with respect to the support, and in particular, they prevent the said component from being subjected to vibrations with respect to the support and the board.

As will have been understood, only one aperture, and a small one at that, is necessary in the board to allow the stylus to pass through.

The above description represents the case in which the retaining 30 device has two elastic arms, which correspond to an advantageous embodiment. The device could also, however, have only one arm, or on the other hand it may include a greater number of arms than two.

What is claimed is:

1. A device for retaining mechanically, with respect to a support, an electronic component that is connected to a circuit board which is mounted on the support, the device comprising:
   a main wall for engagement against a wall of the support,
   at least one elastic arm defining a U-shaped return with respect to the main wall,
   complementary connection means carried on the main wall and the at least one elastic arm which enable the at least one elastic arm to be maintained in a position compressed towards the main wall, each complementary connection means being adapted to be disengaged with respect to the other complementary connection means by a thrust force, to release the at least one elastic arm and allow the at least one elastic arm to come into abutment against the electronic component.

2. A device according to claim 1, wherein the main wall is extended at an end opposite to the at least one elastic arm by a plate portion that is turned back toward the at least one elastic arm, the complementary connection means which enable the at least one elastic arm to be held in a compressed position being carried by the at least one arm and by the plate portion, the complementary connection means being adapted to be disengaged by exertion of the thrust force on the plate portion by a tool.

3. A device according to claim 2, comprising two tongues extending from the main wall on either side of the plate portion, each tongue terminated by a positioning flange.

4. A device according to claim 1, wherein the complementary connection means which enable the at least one elastic arm to be held in a compressed position with respect to the main wall comprises at least one hook-shaped lug and a complementary hole.

5. A device according to claim 1, comprising means for guiding positioning of the device with respect to the wall of the support against which the device is engaged.

6. A device according to claim 5, wherein the means for guiding comprises at least one positioning flange which extends the main wall and is adapted to come into engagement against an edge of the wall of the support.

7. A device according to claim 1, comprising a plurality of elastic arms, each of the plurality of elastic arms defining a U-shaped return with respect to the main wall.

8. A device according to claim 7, comprising two elastic arms defining U-shaped returns with respect to the main wall.

9. A method of retaining a component of a circuit board mounted on a support,
   wherein a device according to claim 1 is positioned on the support in such a way that the main wall is in abutment against a wall of the support, with the at least one elastic arm compressed towards the main wall,
   wherein the circuit board is placed on the support, the component having been soldered to the circuit board beforehand, and
   wherein the at least one elastic arm is released by means of a thrust force to come into abutment against the component.

10. A method according to claim 9, wherein, in order to disengage the complementary connection means retaining the at least one elastic arm in a compressed position towards the main wall, an operator engages a tool in an aperture of the circuit board, and exerts the thrust force on the device with the tool.

11. A device for retaining a component to a support, the device comprising:
    a main wall for engagement against a wall of the support;
    an elastic arm extending from a first end of the main wall and defining a U-shaped return with respect to the main wall; and
    connection means for maintaining the elastic arm in a position compressed toward the main wall, the connection means adapted to be disengaged by a thrust force and release the elastic arm from being maintained in the position, to allow the elastic arm to come into abutment against the component.

12. The device according to claim 11 further comprising:
    a plate portion substantially perpendicular to the elastic arm and extending from a second end of the main wall opposite the first end, the connection means being carried by the elastic arm and by the plate portion, the connection means adapted to be disengaged by the thrust force exerted on the plate portion.

13. The device according to claim 12 further comprising a tongue extending substantially parallel from the main wall adjacent the plate portion, the tongue terminated by a positioning flange.

14. The device according to claim 11 wherein the connection means comprise:
    a hook-shaped lug; and
    a complementary hole.

15. The device according to claim 11 further comprising:
    guiding means for positioning the device with respect to the wall of the support against which the main wall is to be engaged.

16. The device according to claim 15 wherein the guiding means comprise:
a flange extending from a second end of the main wall opposite the first end, the flange adapted to engage an edge of the wall of the support.

17. The device according to claim 11 comprising a plurality of elastic arms, each of the plurality of elastic arms defining a U-shaped return with respect to the main wall.

18. A method of retaining a component to a support, the method comprising:
positioning the device according to claim 11 on the support in such a way that the main wall is in abutment against a wall of the support, with the elastic arm compressed toward the main wall;
positioning the component on the support, the component carried by a circuit board mounted on the support; and
releasing with the thrust force the elastic arm to come into abutment against the component.

19. The method according to claim 18, the device further comprising a plate portion substantially perpendicular to the elastic arm and extending from a second end of the main wall opposite the first end, the connection means being carried by the elastic arm and by the plate portion, the connection means adapted to be disengaged by the thrust force exerted on the plate portion wherein, in order to disengage the connection means, the method wherein the step of releasing the elastic arm comprises:
exerting the thrust force on the plate portion to disengage the connection means, the force exerted by one of a tool, an operator, a forming mechanism, heating or cooling.

20. The method according to claim 19, wherein the thrust force exerted on the plate portion is applied by the operator engaging the tool in an aperture of the circuit board.

* * * * *